United States Patent [19]
Harada et al.

[11] Patent Number: 5,959,343
[45] Date of Patent: Sep. 28, 1999

[54] SEMICONDUCTOR DEVICE

[75] Inventors: Hirofumi Harada; Yutaka Saitoh, both of Chiba, Japan

[73] Assignee: Seiko Instruments R&D Center Inc., Japan

[21] Appl. No.: 08/839,912

[22] Filed: Apr. 21, 1997

[51] Int. Cl.⁶ .................................................. H01L 29/00
[52] U.S. Cl. ........................ 257/528; 257/537; 257/538
[58] Field of Search .................................. 257/537, 538, 257/528; 341/155, 156, 159

[56] References Cited

U.S. PATENT DOCUMENTS

| | | | |
|---|---|---|---|
| 4,905,072 | 2/1990 | Komatsu et al. | 257/66 |
| 4,999,631 | 3/1991 | Sugimoto | 341/156 |
| 5,128,745 | 7/1992 | Takasu et al. | 257/538 |
| 5,164,337 | 11/1992 | Ogawa et al. | 437/228 |
| 5,187,559 | 2/1993 | Isobe et al. | 257/538 |
| 5,254,497 | 10/1993 | Liu | 437/173 |

*Primary Examiner*—Wael M. Fahmy
*Attorney, Agent, or Firm*—Adams & Wilks

[57] ABSTRACT

A semiconductor device comprises a reference voltage device for outputting a constant voltage, a voltage dividing device receptive of the constant voltage for dividing the constant voltage and outputting different currents, a digital signal processing device receptive of the different currents outputted by the voltage dividing device and outputting voltages, and a voltage amplifying device receptive of at least a ground voltage and one of the voltages outputted by the digital signal processing device and outputting a signal produced by amplifying the voltage of the digital signal processing device. The voltage dividing device comprises a ladder resistor circuit having a substrate, an insulating film disposed on the substrate, a first polycrystal silicon film disposed on the insulating film, an interlayer insulating film disposed on the first polycrystal silicon film, and a second polycrystal silicon film disposed on the interlayer insulating film and electrically connected to the first polycrystal silicon film.

30 Claims, 9 Drawing Sheets

F I G. 5
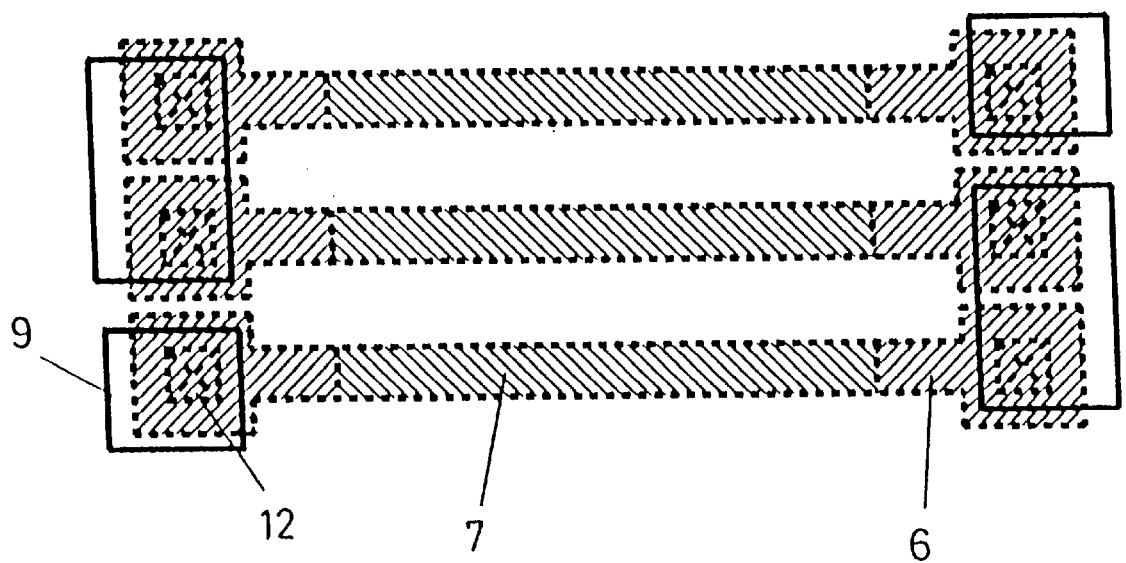

SEMICONDUCTOR DEVICE

BACKGROUND OF THE INVENTION

1. Field of the Invention

The present invention relates to a ladder resistor circuit made of a multilayer of polycrystal silicon films, and a semiconductor device constituted by this ladder resistor circuit and a transistor.

2. Description of the Related Art

FIG. 2 is a sectional view for schematically showing resistor elements used in a conventional ladder resistor circuit, and a conventional insulated gate field-effect transistor (will be abbreviated as an "MISFET" hereinafter).

In this drawing, a polycrystal silicon film is formed via an oxide film 2 on a surface of a substrate 1. This polycrystal silicon film constitutes a gate electrode of the MISFET having a gate oxide film 3 formed by a portion of the oxide film 2, a source/drain region 4, and a gate electrode 5, and also a resistor element. High concentration impurity regions 6 are formed on both sides of the resistor element made of the polycrystal silicon film, and a low concentration impurity region 7 for determining a resistance value of the resistor element is formed between these high concentration impurity regions 6. A metal wiring line 9 is provided via a contact hole of an intermediate insulating film 8 on the high concentration impurity regions 6 of this resistor element, so that an ohmic contact with the high concentration impurity regions 6 can be maintained. Further, silicon nitride film passivation 10 is provided over the entire portion. A ladder resistor circuit is formed on the same substrate surface in such a manner that a plurality of resistor elements shown in FIG. 2 are connected via metal wiring lines in series to each other, or in parallel to each other.

However, conventionally, when the insulated gate field-effect transistor and the ladder resistor circuit are manufactured as the integrated circuit, there are the following problems.

That is, in the case that the resistance value of the resistor element constituted by the polycrystal silicon is designed to be large, the length of this resistor element must be made long in directly proportional to this large resistance value. Accordingly, the chip size is increased and thus the low cost circuit cannot be provided. In particular, in the D/A converter and the A/D converter where the area and the precision of the ladder resistor circuit may give great influences to the product cost and also the product performance, when the gate electrode of the insulated gate field-effect transistor and the ladder resistor are manufactured by the common thin film, which are formed on the same substrate, the area of the ladder resistor is increased. Therefore, the product cost is increased as well.

SUMMARY OF THE INVENTION

The present invention has been made to solve the above-described problems of the conventional semiconductor device, and therefore, has an object to provide such a semiconductor device for simultaneously integrating a transistor and a ladder resistor circuit in low cost and high precision, in which a resistance value of a ladder resistor circuit per unit area can be increased, and a chip size can be decreased.

To solve the above-described problems, a semiconductor device, according to an aspect of the present invention, is featured by comprising: reference voltage means; voltage amplifying means; voltage dividing means; and digital processing means; wherein:

the voltage amplifying means inputs at least a ground voltage and a voltage selected from voltages of the digital signal processing means, and outputs a signal produced by amplifying the voltage of the digital signal processing means;

the voltage dividing means is constructed of a ladder resistor circuit; and the voltage dividing means divides a voltage outputted from the reference voltage means and also outputs a plurality of currents different from each other to the digital voltage signal processing means.

In a semiconductor device comprising: reference voltage means; voltage comparing means; voltage dividing means; and an encoder; wherein:

the voltage amplifying means inputs at least a ground voltage and a voltage selected from voltages of the digital signal processing means, and outputs a signal corresponding to a difference between the two voltages to the encoder;

the encoder inputs signals from the plurality of voltage comparing means to compare the signals from the plurality of voltage comparing means with each other, and outputs a plurality of voltages; and the voltage dividing means is constituted by the ladder resistor circuit and divides the voltage outputted from the reference voltage means, the ladder resistor circuit is made of a first polycrystal silicon film provided via an insulating film on a substrate, and a second polycrystal silicon film electrically connected via an interlayer insulating film to the first polycrystal silicon film.

Also, a semiconductor device, according to another aspect of the present invention, is featured by including: the first polycrystal silicon film, the interlayer insulating film, the second polycrystal silicon film, and the insulated gate field-effect transistor; wherein:

a gate electrode of the insulated gate field-effect transistor is constructed of the first polycrystal silicon film having a thickness of 2,000 Å to 4,000 Å, the impurity concentration of which is larger then, or equal to $10^{20}$ atoms/cm$^3$; and the ladder resistor circuit is constituted by the second polycrystal silicon film.

Further, a semiconductor device, according to another aspect of the present invention, is featured by that the thickness of the second polycrystal silicon film is thinner than that of the first polycrystal silicon film.

Also, a semiconductor device, according to another aspect of the present invention, is featured by the film thickness of the second polycrystal silicon film is from 100 Å to 1,000 Å, and impurity concentration thereof is from $1 \times 10^{15}$ to $5 \times 10^{19}$ atoms/cm3.

In particular, a semiconductor device, according to another aspect of the present invention, is featured by that a film thickness of the second polycrystal silicon is 500 Å.

Furthermore, a semiconductor device, according to another aspect of the present invention, is featured by that the interlayer insulating film is an NSG (nondoped silicate glass) film having a thickness of 1,000 Å to 4,000 Å.

Also, a semiconductor device, according to a further aspect of the present invention, is featured by that the interlayer insulating film is a thermal oxide film having a thickness of 200 Å to 700 Å.

In accordance with employment of the above-described semiconductor device, since the ladder resistor circuit is formed by a multilayer structure of the polycrystal silicon film, the resistor intervals are no longer required, so that the area can be reduced.

Also, since the gate electrode of the insulated gate field-effect transistor is formed by the first layer of the polycrystal silicon film and the ladder resistor circuit is formed by the second layer of the polycrystal silicon film, the thickness, the thermal process condition, and the impurity implanting condition of the polycrystal silicon film for constituting the ladder resistor circuit can be freely set irrelevant to the thickness, the thermal process condition, and the impurity implanting condition of the polycrystal silicon film for constituting the gate electrode of the MISFET.

Also, since the ladder resistor circuit is formed by the thin film of the polycrystal silicon film, the high resistance value can be obtained when the impurity having the same concentration is implanted, as compared with such a case that the ladder resistor circuit is formed by the thick film of the polycrystal silicon film. As a result, the length of the resistor of the ladder resistor circuit can be shortened, and thus the area required for the ladder resistor circuit can be made small.

Also, the film thickness of said second polycrystal silicon film is from 100 Å to 1,000 Å, and impurity concentration thereof is from $1 \times 10^{15}$ to $5 \times 10^{19}$ atoms/cm$^3$. Accordingly, the resistance value of the resistor element for constructing the ladder resistor circuit can be obtained under stable condition, and the fluctuations in the resistance values caused by the fluctuations in the impurity concentration can be suppressed.

Furthermore, said interlayer insulating film is an NSG (nondoped silicate glass) film having a thickness of 1,000 Å to 4,000 Å. As a consequence, the contact etching failure and the leak caused by the pin hole of the NSG film can be prevented.

Alternatively, the interlayer insulating film is a thermal oxide film having a thickness of 200 Å to 700 Å. As a consequence, it is possible to avoid the leak occurred between the first layer of the polycrystal silicon layer and the second layer of the polycrystal silicon layer, and also to avoid that the emerging of the ion implantation executed through this thermal oxidation film is increased.

BRIEF DESCRIPTION OF THE DRAWINGS

A more complete understanding of the teachings of the present invention may be acquired by referring to the accompanying figures, in which like reference numbers indicate like features and wherein:

FIG. 5 is a plan view for representing the resistor element of the present invention;

DETAILED DESCRIPTION OF THE PREFERRED EMBODIMENTS

Figure 1:
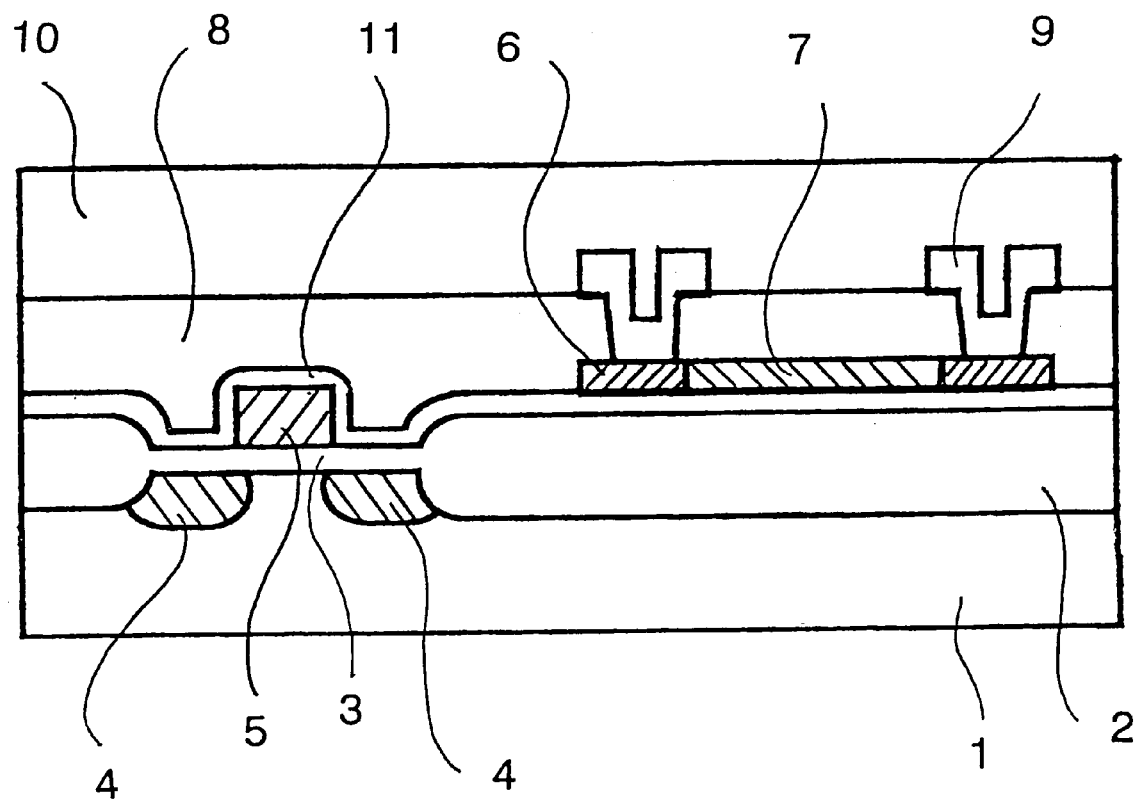
FIG. 1 is a sectional view for showing an MISFET and a resistor element, according to the present invention.
Figure 2:
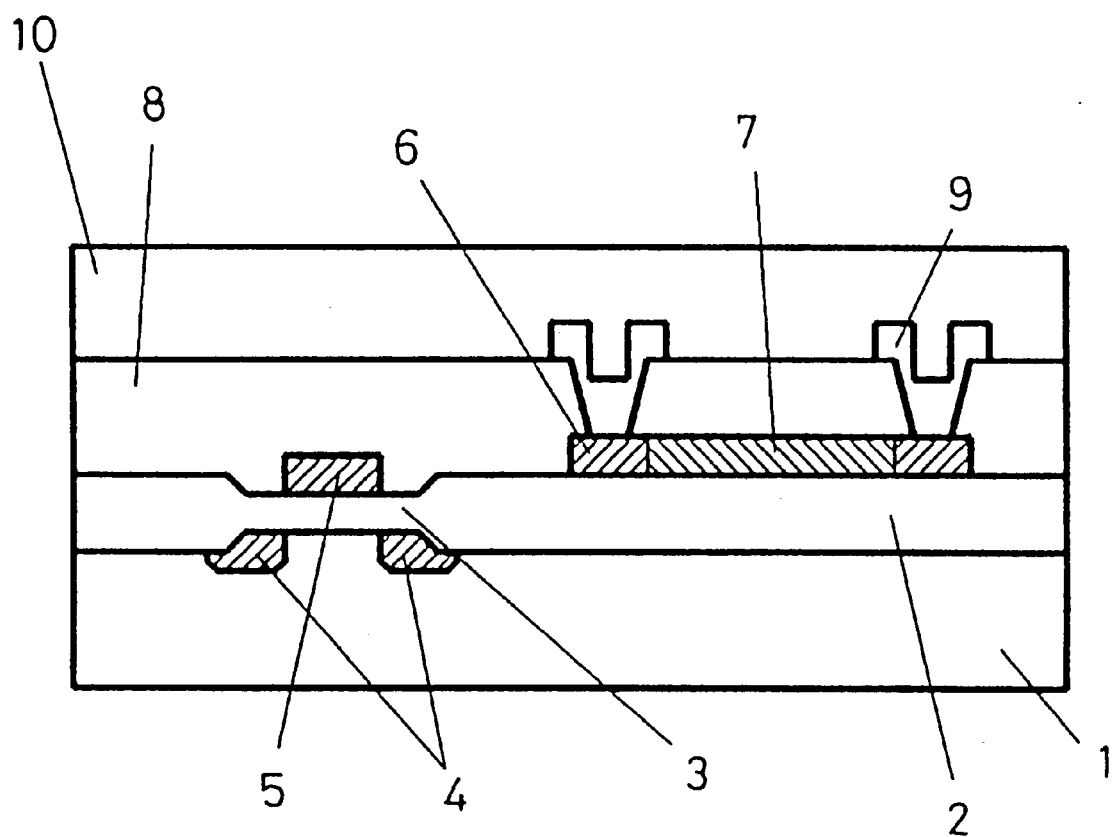
FIG. 2 is a sectional view for indicating the conventional MISFET and the conventional resistor element.

FIG. 1 is a sectional view for schematically showing an MISFET (metal insulator semiconductor FET) and a resistor element, which constitute a semiconductor device according to the present invention. An oxide film 2 is formed on a surface of a substrate 1. A first polycrystal silicon film is provided on the oxide film 2. This first polycrystal silicon film is formed by way of the low pressure CVD (chemical vapor deposition) under temperatures of 500° C. to 700° C., and is mainly used as a gate electrode of the MISFET. As a result, generally speaking, this first polycrystal silicon film is made in such a manner that a film thickness is 2,000 Å to 4,000 Å, impurity concentration is larger than, or equal to $1 \times 10^{20}$ atoms/cm$^3$, and a sheet resistance is lower than, or equal to 100 Ω/□. An interlayer insulating film 11 is formed on this first polycrystal silicon film. A second polycrystal silicon film is formed on this interlayer insulating film. As this interlayer insulating film, either NSG (nondoped silicate glass) film or a thermal oxide film may be selected. In the case that the NSG film is selected, a film thickness is selected to be from 1,000 Å to 4,000 Å in order to prevent a leak caused by the contact etching failure and the pin hole of this NSG film. In the case that the thermal oxide film is selected, a film thickness is selected to be from 200 Å to 700 Å in order to prevent a leak occurred between the first polycrystal silicon film and the second polycrystal silicon film, and to prevent the energy of the ion implanting through this thermal oxide film from being increased.

The second polycrystal silicon is formed by using the low pressure CVD method in the temperature range from 500° C. to 700° C., and a thickness value of this second polycrystal silicon is selected to be from 500 Å to 2,000 Å in order to avoid such difficulties that when ions are implanted, these implanted ions pass through this second polycrystal silicon film to an underlayer film, and also the coverage fails. The second polycrystal silicon film is made of two regions, namely a low concentration impurity region 7 and a high concentration impurity region 6. This second polycrystal silicon film is mainly used in a ladder resistor circuit having a high resistance value, and is arranged by a resistor element such that the high concentration impurity regions provided so as to obtain an ohmic contact with a metal wiring line are formed on both sides of the low concentration impurity region for determining the resistance value. The impurity concentration of this low concentration impurity region is selected to be $1 \times 10^{15}$ to $5 \times 10^{19}$ atoms/cm$^3$ in order to obtain a stable resistance value as the resistor element. The optimum impurity concentration is preferably selected from $1 \times 10^{17}$ to $5 \times 10^{19}$ atoms/cm$^3$.

An interlayer insulating film 8 is formed on the second polycrystal silicon film. A contact hole is formed in the interlayer insulating film formed on the high concentration impurity region on the second polycrystal silicon film. A metal electrode 9 is provided so as to be electrically connected via this contact hole to each of the high concentration impurity regions. In general, an aluminum electrode is employed as this metal electrode. Silicon nitride film passivation 10 is provided on the metal electrode 9.

As previously described, since the thickness of the second polycrystal silicon film can be arbitrarily selected between 500 Å and 2,000 Å, it is possible to select 1,000 Å which is thinner than that of the first polycrystal silicon. In this case, in order to obtain the same resistance value as that of the first polycrystal silicon resistor, concentration of an impurity which is doped into the second polycrystal silicon may be made higher than that when the resistor is formed by using the first polycrystal silicon. When the concentration of the polycrystal silicon low concentration region used to determine the resistance value of the polycrystal silicon resistor is increased, since the rate at which the implanted impurity is segregated on the grain boundary can be decreased, fluctuations in the resistance values can be reduced which are caused by segregation fluctuations in the impurities. As a consequence, in order to manufacture the ladder resistor circuit in a high precision, the thickness of the polycrystal silicon for constituting the resistor element is made thin.

Such a structure may be applied to various types of semiconductor integrated circuits which require MISFETs and ladder resistor circuits made in a high precision.

Figure 3:
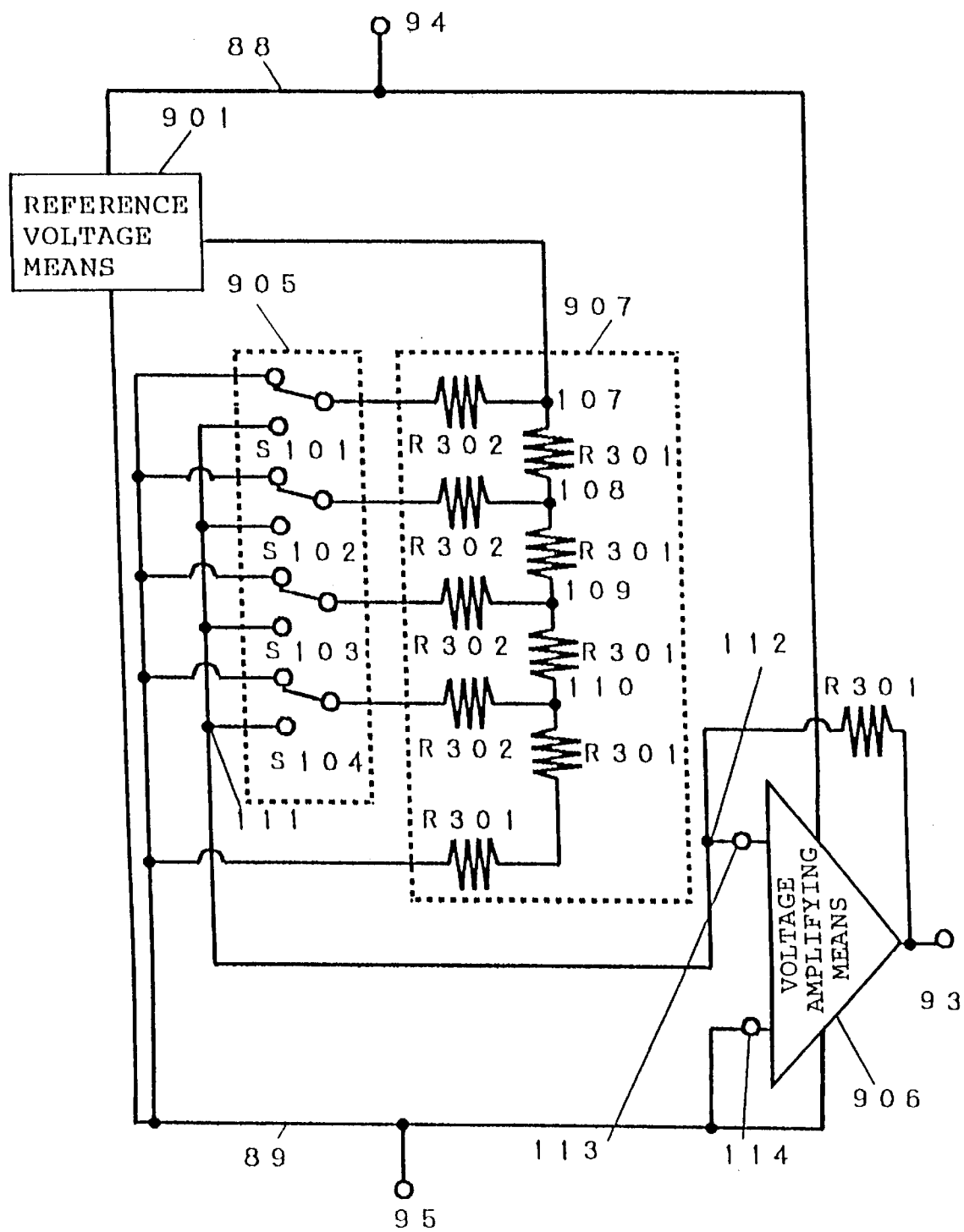
FIG. 3 is a circuit diagram of an A/B converter according to an embodiment of the present invention.

As one example, a current comparison type D/A converter may be conceived, the circuit diagram of which is shown in FIG. 3. The D/A converter corresponds to a semiconductor device for converting a binary digital voltage signal into an analog voltage signal in a decimal notation. FIG. 3 shows one example of a D/A converting circuit for realizing a voltage signal conversion based on differences in amounts of currents flowing through the circuit. This D/A converter is constructed of reference voltage means 901, digital voltage signal processing means 905, voltage amplifying means 906, and a ladder resistor circuit 907 functioning as voltage dividing means. The ladder resistor circuit 907 is arranged by a plurality of resistors R301 and R302. An analog voltage signal is outputted from an output terminal F 93 of this D/A converter.

The reference voltage means 901 is connected between a power supply line 88 and a ground line 89, and owns a function to output a constant voltage to a connection point Q 107.

The digital voltage signal processing means 905 owns such a function that the binary digital voltage signal entered thereto is processed, and in response to the respective bits of the binary signal, switches S101 to S104 are switched between a connection point U 111 and a ground terminal H 95. Then, a constant current corresponding to the digital voltage signal is outputted to the connection point U 111. In this case, this digital voltage signal is a 4-bit digital voltage signal. When the digital voltage signal is "1010", the switches S101 and S103 are switched to the connection point U 111, and the switches S102 and S104 are switched to the ground terminal H 95.

The voltage amplification of the voltage amplifying means 906 is more than 100 times and this voltage amplifying means 906 owns two input terminals, and such a function to amplify a difference between the voltage applied to two input terminals and then to output the amplified voltage to the output terminals. In this example, a non-inverting terminal of the voltage amplifying means is connected to a ground line 89, and an inverting terminal 113 thereof is connected via a connection point V 112 and a resistor R301 to an output terminal F93, so that the constant current outputted from the digital voltage signal processing means 905 is converted into an output voltage. Since the voltage amplification of this voltage amplifying means 906 is more than 100 times, namely high, the potentials at the connection points U 111 and V 112 become 0 V equal to the ground line, and stable.

Assuming now that resistance values of the respective resistors R301 and R302, which constitute the ladder resistor circuit, are selected to be R301 and R302, respectively, these values capable of satisfying the following relationship are selected:

$$R302 = 2 \times R301$$

As previously explained, since the potential at the connection point U 111 is equal to that of the ground terminal H 95, i.e., 0 V, even when the respective switches S101 to S104 employed in the digital voltage signal processing means are switched to any one of the connection point U 111 and the ground terminal H 95, the potential on the side of the digital voltage signal processing means becomes 0 V with respect to R302. In accordance with the above-described condition, equivalent resistance value of a lower side is equal to R302 (=2 R301), as viewed from any connection points of Q 107, R 108, S 109, and T 110. As a result, assuming now that the current flowing from the reference voltage means to the connection point Q is "IR", currents flowing from the switches S101 to S104 become IR/2, IR/4, IR/8, and IR/16, respectively. A ratio of this current corresponds to a ratio when the respective binary bits are converted into the decimal number.

When the constant voltage outputted form the reference voltage means 901 is VR, the output voltage derived from the output terminal F93 is VO, and the respective bits corresponding to the switches S101 to S104 are B1, B2, B3, B4 (note that symbols B1 to B4 are either "1" or "0", and this combination indicates a digital voltage signal), the analog output voltage V0 is given as follows:

$$V0 = -[(1/2)B1 + (1/4)B2 + (1/8)B3 + (1/16)B4]VR.$$

R301 and R302 corresponding to the constructive elements of the ladder resistor circuit employed in this D/A converter are formed by polycrystal silicon resistors. The constants such as 1/2 and 1/4 contained in the above-described formula are obtained based upon a ratio of resistors R301 to R302, namely R302=2 R301. As a consequence, this is determined by a ratio of the polycrystal silicon resistors. Therefore, the precision of this resistance ratio may give influences to the precision of the D/A converter.

In the ladder resistor circuit of FIG. 3, when the bit number of the digital signal to be converted is increased by 1, a total number of sets of the resistors R301 and R302 connected parallel to each other is increased by 1. That is, when the bit number of the digital signal is increased so as to increase the resolution factor of the signal, the area required for the ladder resistor circuit is increased. However, this polycrystal silicon resistor is formed by the second polycrystal silicon film (will be discussed later), so that the ladder register circuit can be precisely formed by a small area.

This method may be applied to all of the D/A converter circuits containing the ladder resistor circuits constituted by the polycrystal silicon resistors.

Figure 4:
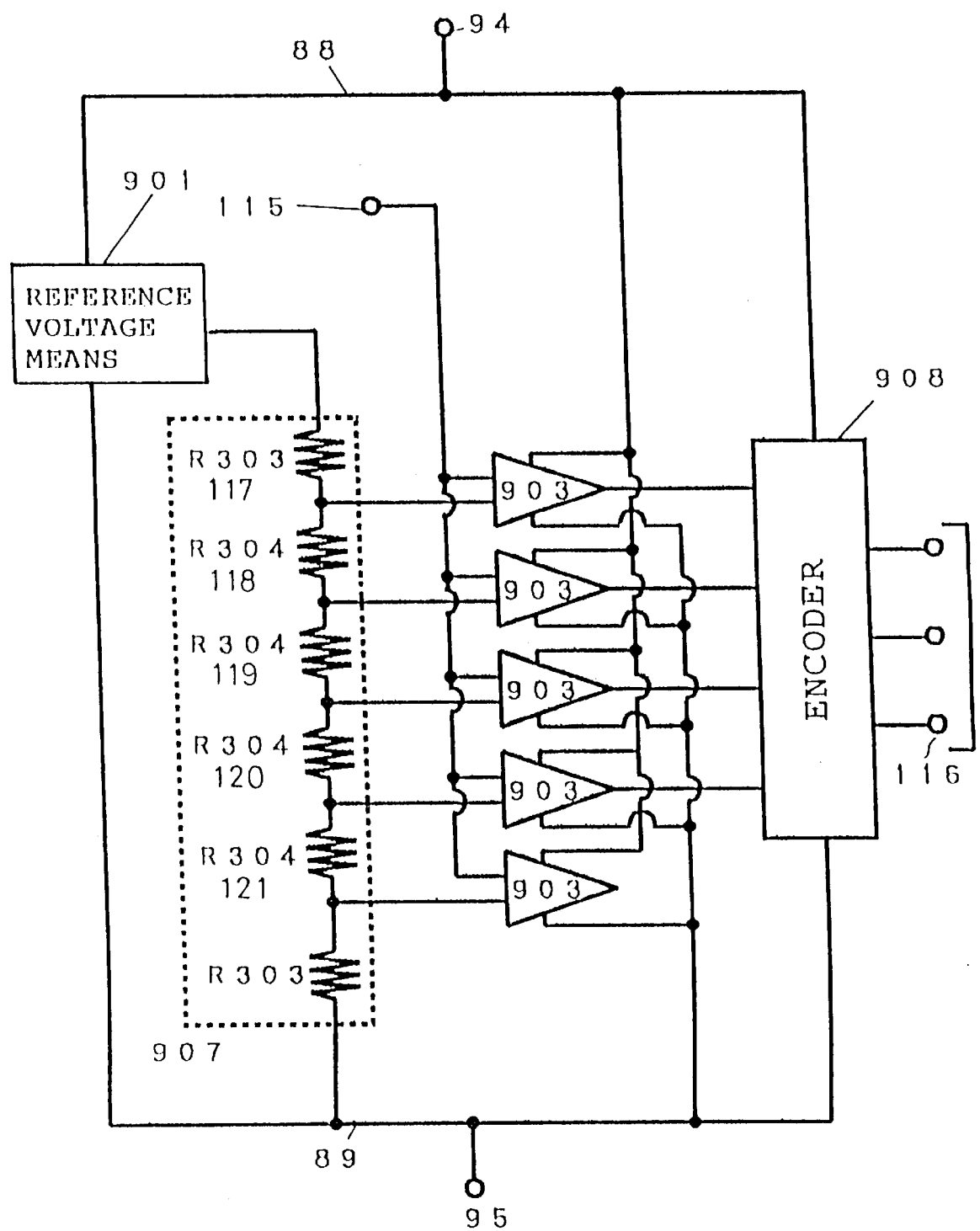
FIG. 4 is a circuit diagram of a D/A converter according to an embodiment of the present invention.

FIG. 4 is a circuit block diagram when the present invention is applied to a parallel comparison type A/D converter. An A/D converter is such a semiconductor device for converting an analog voltage signal into a binary digital voltage signal. FIG. 4 shows an A/D converter circuit for comparing an analog input voltage with various constant voltages, and for selecting the constant voltage most approximated to this analog input voltage to convert this selected constant voltage into a binary digital voltage.

The A/D converter is arranged by reference voltage means 901, a ladder resistor circuit 907 constructed of a plurality of resistors R303 and R304 functioning as voltage dividing means, a plurality of voltage comparing means 903, and an encoder 908. This A/D converter converts an analog voltage signal entered from an analog input voltage signal input terminal W 115 into a binary digital voltage signal, and outputs this binary digital voltage signal from a digital voltage signal output terminal X 116. FIG. 4 corresponds to, for instance, a 3-bit digital voltage signal.

The reference voltage means 901 is connected between a power supply line 88 and a ground line 89, and owns a function to output a constant voltage to the ladder resistor circuit 907. As an initial condition, the constant voltage outputted from the reference voltage means is higher than the voltage entered from the analog voltage signal input terminal 115.

The ladder resistor circuit 907 is arranged by a plurality of resistors R303 and R304, and owns a function to divide the constant voltage outputted from the reference voltage means into a plurality of voltages to output these plural voltages to a plurality of voltage comparing means 903.

The voltage comparing means 903 owns a function to compare the analog voltage signal entered from an analog voltage signal input terminal W 115 with the voltage derived from the ladder resistor circuit 907, and to output different voltages, depending upon the magnitudes of the compared voltages.

The encoder 908 is arranged by logic circuits such as a plurality of OR gate circuits, and owns the following function. A set of voltages outputted from a plurality of voltage comparing means are entered, the plural voltages are compared with each other and are converted into a binary digital voltage signal, and then this binary digital voltage signal is outputted to a digital voltage output terminal X 116.

The constant voltage outputted from the reference voltage means 901 is subdivided based on a resistance ratio of the ladder resistor circuit such as the resistors R303 and R304. In this case, five voltages are obtained from the connection points Y 107, Z 118, AA 119, BB 120, and CC 121. These plural voltages are compared with each of the analog voltage input signals by the voltage comparing means. When the analog voltage input signal is higher than the voltage, the power supply voltage is outputted from the voltage comparing means to the encoder. When the analog voltage input signal is lower than the voltage, the ground voltage (0 V) is outputted from the voltage comparing means to the encoder. In other words, for example, when the voltage value of the analog voltage input signal is equal to a value between the voltage value of the connection point Z 118 and the voltage value of the connection point AA 119, assuming now that the power supply voltage is 1 and the ground potential is 0, the output from the voltage comparing means becomes "00111" from the upper digit order. This signal is approximated to the analog voltage input signal, and then this signal is converted by the encoder, so that the analog voltage signal expressed by the binary notation to produce a digital voltage signal is obtained from the output terminal.

In this embodiment, since the resistors R301 and R302 which are the constructive elements of the ladder resistor circuit employed in this A/D converter are manufactured by the polycrystal silicon resistors, the precision in the resistance ratio of the polycrystal silicon may give influences in the precision of the digital voltage output signal.

As will be explained later, this polycrystal silicon resistor is formed by the second polycrystal silicon film, so that the ladder resistor circuit can be made in a small area and in a high precision. Also, this method may be applied to all of the A/D converter circuits containing the ladder resistor circuits constituted by the polycrystal silicon resistors.

As previously described, in most of the A/D converters and of the D/A converters, the ladder resistor circuits made by the resistor elements constructed of the polycrystal silicon film are employed in order to divide the voltage, or shunt the current. Either the voltage dividing precision of this ladder resistor circuit or the current shunting precision of this ladder resistor circuit may give large influences to the conversion precision of the A/D converter, or the D/A converter. In general, if the digital bit number for conversion is large, then the extra resistor elements whose number is equal to the added bit number must be formed. The higher the resolution performance of the digital signal is increased, the larger the area of the ladder resistor circuit is increased. This may cause high cost, depending on the increase of the chip area. In other words, both the increase of the precision and the reduction of the area of the ladder resistor circuit constitute very significant factors for giving influences to the product precision and the product cost of the A/D converter and the D/A converter.

As indicated in FIG. 5, all of the resistor elements provided in the ladder resistor circuits employed in the D/A converter and the A/D converter, as described in FIG. 3 and FIG. 4, are formed by a series connection, or a parallel connection of the minimum resistor members made of polycrystal silicon films. This minimum resistor member is such a resistor member having a minimum width and a minimum length in a range where fluctuations in resistance values are not increased. The ladder resistor circuit is constituted by electrically connecting a plurality of minimum resistor members in the same intervals by metal wiring lines. The high concentration impurity regions 6 are provided on both sides of each minimum resistor member in order to obtaining an ohmic contact with the metal wiring line. The low concentration impurity region 7 is formed between these high concentration impurity region 6. The resistance value of the resistor element is determined by the concentration of the impurity of this region, the film thickness of the polycrystal silicon film, and the width and length of the minimum resistor member. That is, if the width and the length of this minimum resistor member can be reduced without deteriorating the resistance value of the minimum resistor member and the fluctuations in the resistance value, then the area of the ladder resistor circuit can be reduced.

Figure 6:
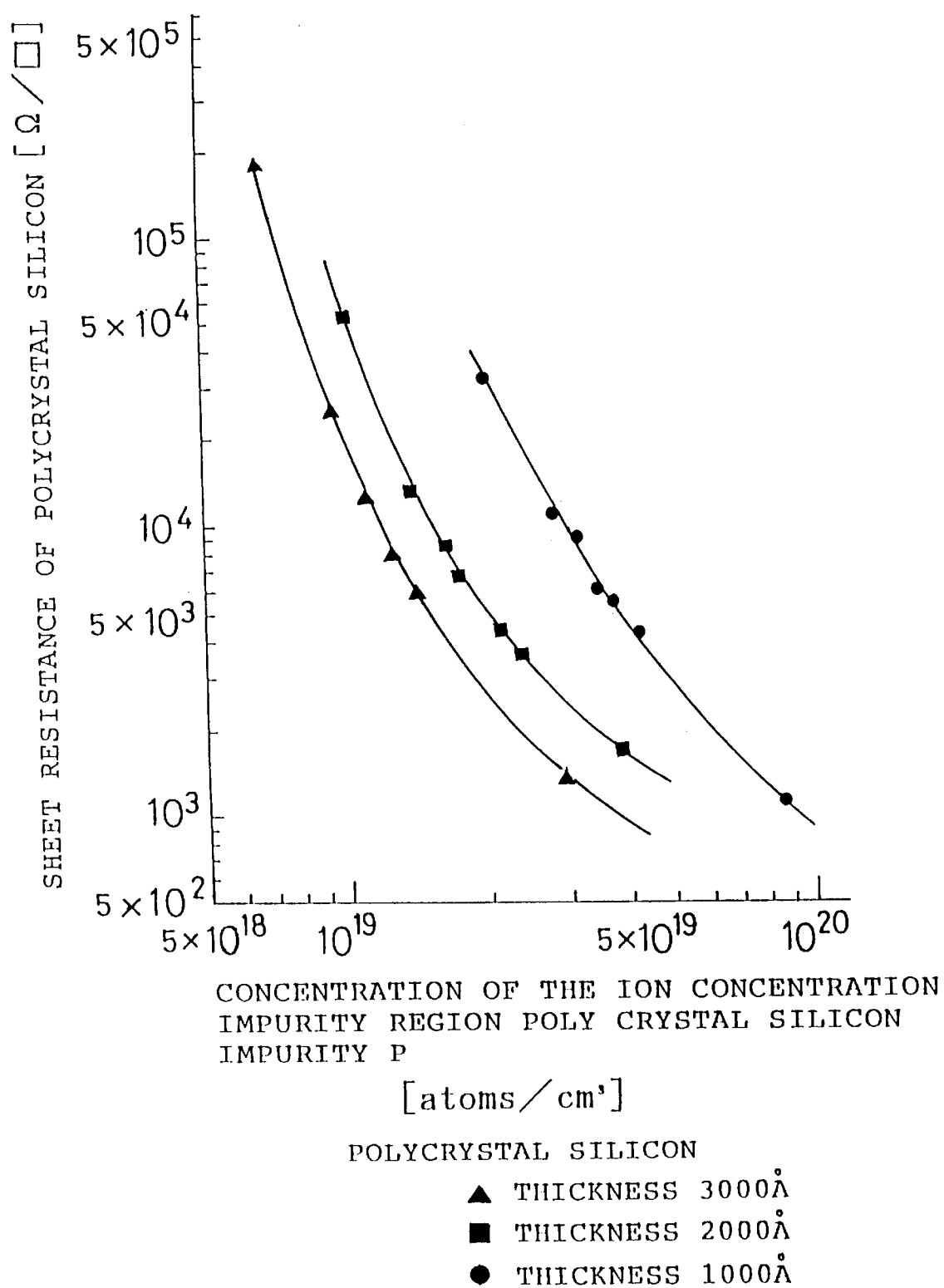
FIG. 6 is a graphic representation for representing a relationship between concentration of a polycrystal silicon low concentration impurity and a polycrystal silicon sheet resistance about the resistor element of the present invention.

FIG. 6 graphically represents a depending characteristic of a sheet resistance of polycrystal silicon with respect to the concentration of the low concentration impurity region for determining a resistance value of a polycrystal silicon resistor, while using a thickness of a polycrystal silicon film as a parameter. When the concentration of the low concentration impurity region of the polycrystal silicon resistor is made thin, the fluctuation in the resistance value of the polycrystal silicon resistor is increased, due to the polycrystal silicon characteristic such as the implanted impurity is segregated on the grain boundary. However, when the same resistance value is obtained, if the thickness of the polycrystal silicon film is made thin, then the concentration of the low concentration impurity region can be increased, as compared with the thick film thickness, since the resistance value thereof can be made large. Accordingly, the influence in the segregation fluctuation of the impurity can be lowered. As a result, when the resistor element having the same resistance value is formed, the thin film thickness of the polycrystal silicon film has a merit with respect to the resistance value fluctuations caused by the impurity concentration.

Figure 7:
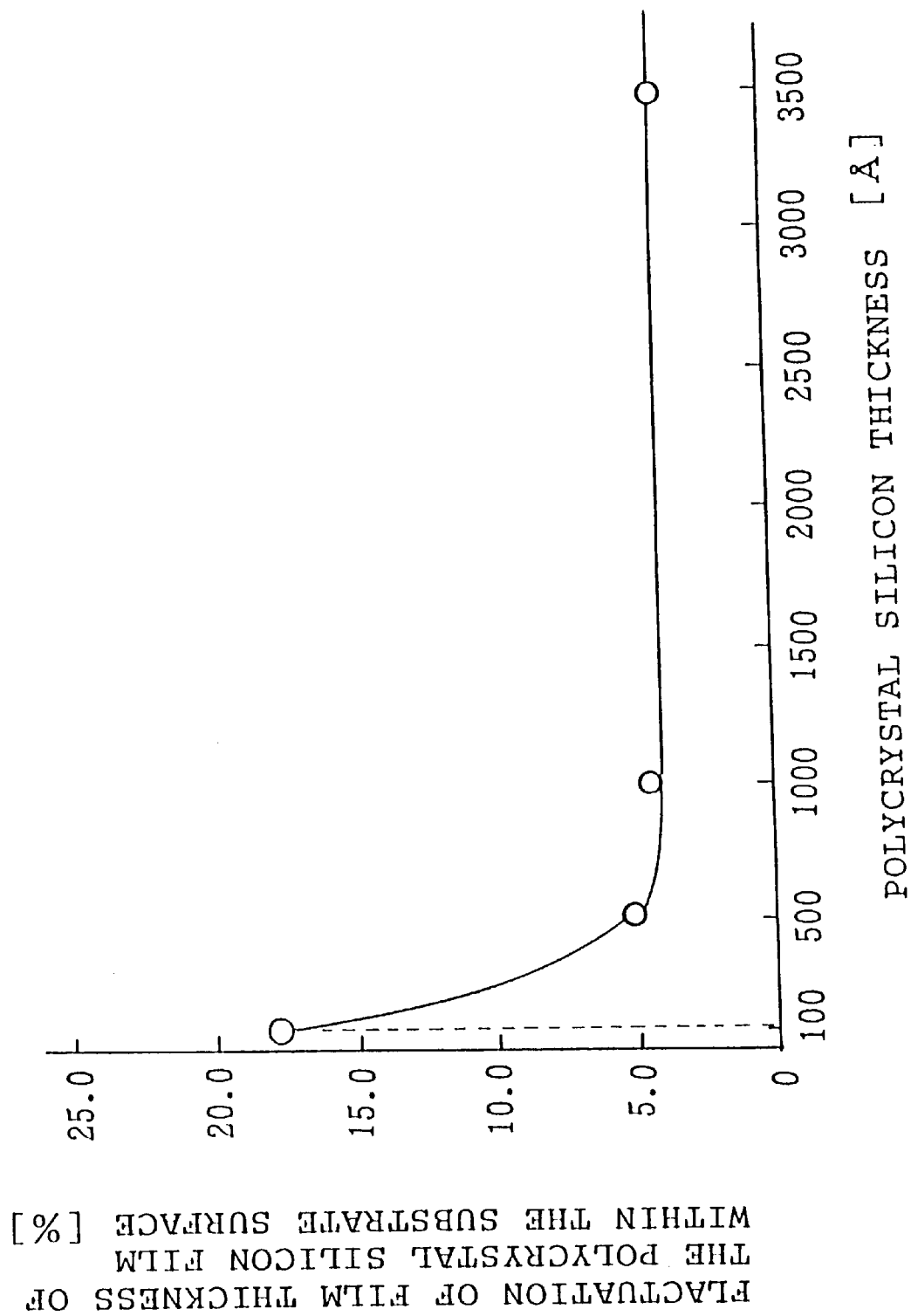
FIG. 7 is a graphic representation for showing a relationship between a polycrystal silicon film thickness and fluctuations of polycrystal silicon film thickness in a substrate plane, about the resistor element of the present invention.

FIG. 7 graphically indicates fluctuations of film thickness of the polycrystal silicon film within the substrate surface with respect to the film thickness of the polycrystal silicon film. As indicated in FIG. 7, when the film thickness of the polycrystal silicon film is made thinner than 500 Å, the fluctuations of the polycrystal silicon film in the substrate surface cannot be neglected. As a consequence, the resistance value fluctuations in the resistor element constituted by the polycrystal silicon film are influenced by the film thickness influences. Accordingly, the minimum film thickness may be selected to be 500 Å in order to reduce the resistance value fluctuations in the resistor element.

Figure 8:
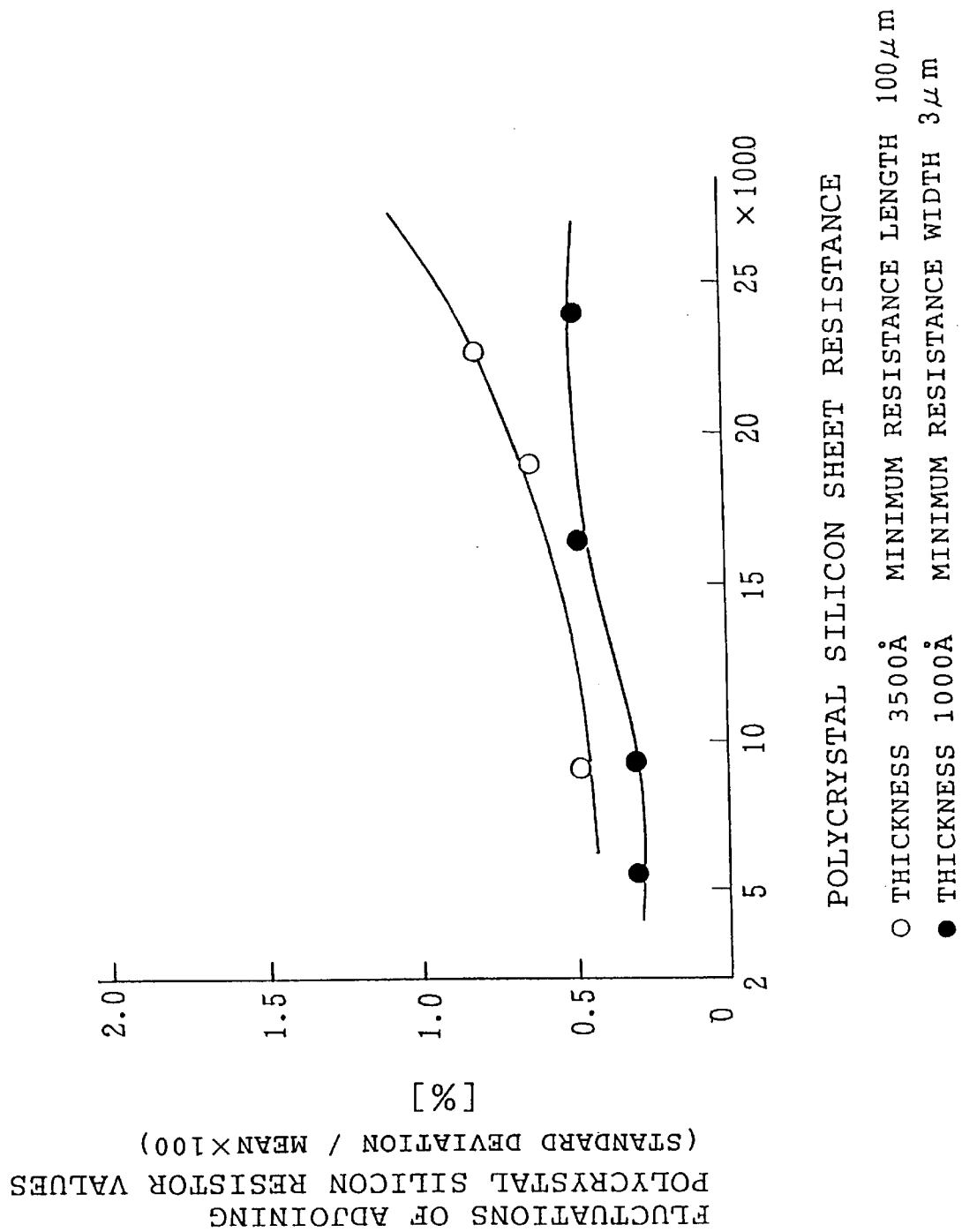
FIG. 8 is a graphic representation for indicating a relationship between a polycrystal silicon sheet resistor and fluctuations of adjoining polycrystal silicon resistor values about the resistor element of the present invention.

FIG. 8 graphically indicates a depending characteristic of resistance value fluctuations with respect to a sheet resistance of a resistor element made by a polycrystal silicon film, while using the film thickness of the polycrystal silicon film as a parameter. As understood from the results obtained in FIG. 6 and FIG. 7, when the film thickness is larger than, or equal to 500 Å, there is a small fluctuation in the resistance value if the film thickness is made thin.

Figure 9:
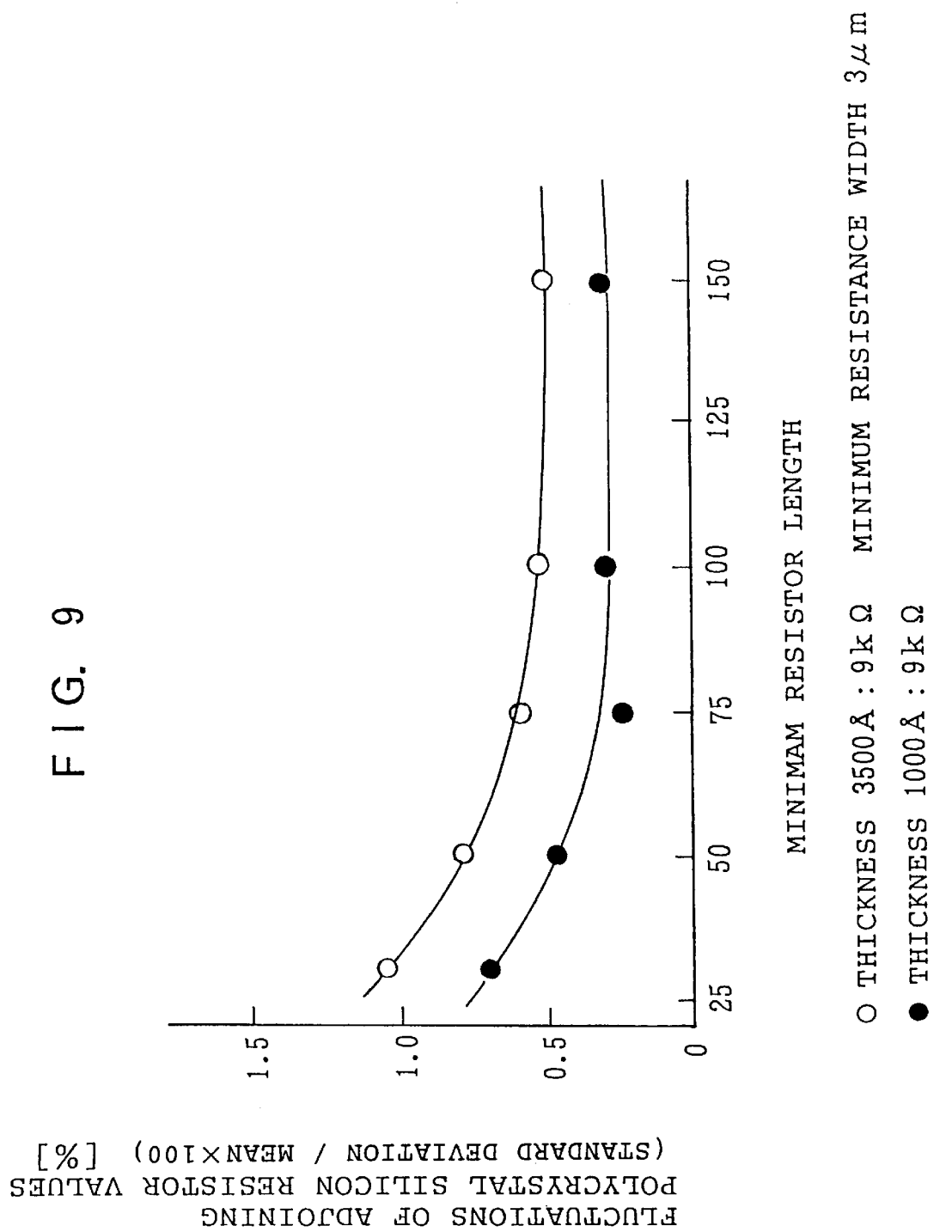
FIG. 9 is a graphic representation for showing a relationship between a minimum resistor length and fluctuations of adjoining polycrystal silicon resistor values.

FIG. 9 graphically represents a depending characteristic of fluctuations in the resistance values with respect to the length of the resistor element, which causes another factor of the resistance value fluctuations of the polycrystal silicon resistor, while using the film thickness of the polycrystal silicon film as a parameter. As shown in this drawing, generally speaking, when the length of the polycrystal silicon resistor is shortened, the fluctuations in the resistance values are increased. When the film thickness of the polycrystal silicon film is made thin, a similar phenomenon will occur. As previously explained, if the film thickness is made thin, then the fluctuation in the impurity segregation is small. As a consequence, the entire fluctuation in the resistance value is small, the increase in the resistance value fluctuation caused by shortening the length of the polycrystal silicon resistor is caused by diffusion fluctuation of the impurities of the high impurity region which is diffused into the low concentration impurity region of the resistor element. Since there is the grain boundary with low crystallinity in the polycrystal silicon film, the impurity is easily diffused into this portion. At the same time, the length of this diffusion is easily fluctuated. Accordingly, when the length of the polycrystal silicon resistor is shortened, the ratio at which this diffusion length fluctuation influences the overall resistance value is increased, so that the fluctuation in the resistance values is increased.

The above-described length of the minimum resistance member is selected based on the trend in this fluctuation of the resistance value. For instance, in the case that the film thickness of the polycrystal silicon film is 3,500 Å in FIG. 9, when the length of the polycrystal silicon resistor is longer than, or equal to 100 μm, such a polycrystal silicon resistor having a small resistance fluctuation is obtained. However, when the film thickness of the polycrystal silicon film is selected to be 1,000, the length of the polycrystal silicon resistor may be longer than, or equal to 50 μm in order to suppress the same resistance value fluctuations. As a consequence, in such a case that the length of the minimum resistor member is selected to be 100 μm under film thickness of 3,500 Å for the polycrystal silicon film, when the film thickness is 1,000 Å, it may be 50 μm. In other words, since the film thickness of the polycrystal silicon film is made thin, the length of the resistor can be made short without deteriorating the resistance value of the resistor element and the resistance fluctuation. As a result, the area of the ladder resistor circuit employing this resistor element can be reduced.

Conversely, if the ladder resistor circuit having the same area is manufactured, then the ladder resistor circuit can be made in a high precision with a small fluctuation in the resistance values by making the polycrystal silicon film thin. Accordingly, if this ladder resistor circuit is employed in the D/A converter and the A/D converter, then the previously explained current shunting precision, or voltage dividing precision can be increased, so that the D/A converter and A/D converter having the high precision can be obtained. Also, as to the D/A converter and the A/D converter, which may compensate for a certain conversion precision, there are advantages that the conversion precision can be increased and the product yield can be increased by employing the polycrystal silicon film with the thin thickness in accordance with the present invention.

In accordance with the present invention, the ladder resistor having the large resistance value can be realized with having the small area. Also, this ladder resistor and the gate electrode of the MISFET formed on the same substrate can be manufactured in the same process.

What is claimed is:

1. A semiconductor device comprising:
   reference voltage means for outputting a constant voltage;
   voltage dividing means receptive of the constant voltage for dividing the constant voltage, and outputting a plurality of different currents, the voltage dividing means comprising a ladder resistor circuit having a substrate, an insulating film disposed on the substrate, a first polycrystal silicon film disposed on the insulating film, an interlayer insulating film disposed on the first polycrystal silicon film, and a second polycrystal silicon film disposed on the interlayer insulating film and electrically connected to the first polycrystal silicon film;
   digital signal processing means receptive of the plurality of different currents from the voltage dividing means for processing the currents and outputting a plurality of voltages; and
   voltage amplifying means receptive of at least a ground voltage and one of the voltages from the digital signal processing means for amplifying the voltage from the digital signal processing means.

2. A semiconductor device as claimed in claim 1; wherein a thickness of one of the first and second polycrystal silicon films is 100 Å to 1,000 Å.

3. A semiconductor device as claimed in claim 1; wherein a thickness of one of the first and second polycrystal silicon films is approximately 500 Å.

4. A semiconductor device as claimed in claim 1; wherein an average grain size of one of the first and second polycrystal silicon films is in the range 200 Å to 1,000 Å.

5. A semiconductor device as claimed in claim 1; further comprising an insulated gate field-effect transistor having a gate electrode formed from the first polycrystal silicon film and having a thickness of 2,000 Å to 4,000 Å and an impurity concentration equal to or greater than $1 \times 10^{20}$ atoms/cm$^3$.

6. A semiconductor device as claimed in claim 5; wherein a thickness of the second polycrystal silicon film is smaller than that of the first polycrystal silicon film.

7. A semiconductor device as claimed in claim 5; wherein the second polycrystal silicon film has a thickness of 100 Å to 1,000 Å and an impurity concentration of $1 \times 10^{15}$ to $5 \times 10^{19}$ atoms/cm$^3$.

8. A semiconductor device as claimed in claim 5; wherein the interlayer insulating film comprises a nondoped silicate glass film having a thickness of 1,000 Å to 4,000 Å.

9. A semiconductor device as claimed in claim 5; wherein the interlayer insulating film comprises a thermal oxide film having a thickness of 200 Å to 700 Å.

10. A semiconductor device as claimed in claim 1; wherein the first polycrystal silicon film comprises a gate electrode of a MISFET.

11. A semiconductor device as claimed in claim 10; wherein the second polycrystal silicon film has a thickness greater than that of the first polycrystal silicon film.

12. A semiconductor device as claimed in claim 11; wherein the second polycrystal silicon film has a thickness of 100 Å to 1,000 Å and an impurity concentration of $1\times10^{15}$ to $5\times10^{19}$ atoms/cm$^3$.

13. A semiconductor device comprising:
reference voltage means for outputting a constant voltage;
voltage dividing means receptive of the constant voltage for dividing the constant voltage into a plurality of voltages, the voltage dividing means comprising a ladder resistor circuit having a substrate, an insulating film disposed on the substrate, a first polycrystal silicon film disposed on the insulating film, an interlayer insulating film disposed on the first polycrystal silicon film, and a second polycrystal silicon film disposed on the interlayer insulating film and electrically connected to the first polycrystal silicon film;
a plurality of voltage comparing means each receptive of an analog voltage and one of the plurality of voltages from the voltage dividing means for comparing the analog voltage and the voltages from the voltage dividing means and outputting a plurality of voltages on the basis of the magnitudes of the compared voltages; and
an encoder receptive of the plurality of voltages from the plurality of comparing means for comparing the plurality of voltages with each other and outputting a plurality of voltage signals.

14. A semiconductor device as claimed in claim 13; wherein a thickness of one of the first and second polycrystal silicon films is 100 Å to 1,000 Å.

15. A semiconductor device as claimed in claim 13; wherein a thickness of one of the first and second polycrystal silicon films is approximately 500 Å.

16. A semiconductor device as claimed in claim 13; wherein an average grain size of one of the first and second polycrystal silicon films is in the range 200 Å to 1,000 Å.

17. A semiconductor device as claimed in claim 13; further comprising an insulated gate field-effect transistor having a gate electrode formed from the first polycrystal silicon film and having a thickness of 2,000 Å to 4,000 Å and an impurity concentration equal to or greater than $1\times10^{20}$ atoms/cm$^3$.

18. A semiconductor device as claimed in claim 17; wherein a thickness of the second polycrystal silicon film is smaller than that of the first polycrystal silicon film.

19. A semiconductor device as claimed in claim 17; wherein the second polycrystal silicon film has a thickness of 100 Å to 1,000 Å and an impurity concentration of $1\times10^{15}$ to $5\times10^{19}$ atoms/cm$^3$.

20. A semiconductor device as claimed in claim 17; wherein the interlayer insulating film comprises a nondoped silicate glass film having a thickness of 1,000 Å to 4,000 Å.

21. A semiconductor device as claimed in claim 17; wherein the interlayer insulating film comprises a thermal oxide film having a thickness of 200 Å to 700 Å.

22. A semiconductor device as claimed in claim 13; wherein the first polycrystal silicon film comprises a gate electrode of a MISFET.

23. A semiconductor device as claimed in claim 22; wherein the second polycrystal silicon film has a thickness greater than that of the first polycrystal silicon film.

24. A semiconductor device as claimed in claim 23; wherein the second polycrystal silicon film has a thickness of 100 Å to 1,000 Å and an impurity concentration of $1\times10^{15}$ to $5\times10^{19}$ atoms/cm$^3$.

25. A semiconductor device comprising: a substrate; a first insulating film disposed on the substrate; a first polycrystal silicon film disposed on the first insulating film and having a first thickness; a second insulating film disposed on the first polycrystal silicon film; and a second polycrystal silicon film disposed on the second insulating film and electrically connected to the first polycrystal silicon film, the second polycrystal silicon film having an impurity concentration of $1\times10^{15}$ to $5\times10^{19}$ atoms/cm$^3$ and a second thickness of approximately 500 Å which is smaller than the first thickness.

26. A semiconductor device as claimed in claim 25 wherein the second insulating film comprises an oxide film.

27. A semiconductor device as claimed in claim 25; wherein the second insulating film comprises a nondoped silicate glass film having a thickness of 1000 Å to 4000 Å.

28. A semiconductor device as claimed in claim 25; wherein the first polycrystal silicon film comprises a gate electrode of a MISFET.

29. A semiconductor device as claimed in claim 28; wherein the first polycrystal silicon film has a thickness of 2000 Å to 4000 Å and an impurity concentration equal to or greater than $1\times10^{20}$ atoms/cm$^3$.

30. A semiconductor device as claimed in claim 25; wherein the second polycrystal silicon film has a plurality of high concentration impurity regions; and further comprising a third insulating film disposed on the second polycrystal silicon film and having a plurality of contact holes disposed over the second polycrystal silicon film, a plurality of metal electrodes each disposed in one of the contact holes and electrically connected to one of the high concentration impurity regions of the second polycrystal silicon film, and a passivation film disposed on the metal electrodes.

* * * * *